United States Patent
Chiueh et al.

(10) Patent No.: US 7,239,660 B2
(45) Date of Patent: Jul. 3, 2007

(54) ADAPTIVE FILTER WITH GSPT LMS ALGORITHM FOR REDUCING COMPLEXITY

(75) Inventors: Tzi-Dar Chiueh, Taipei (TW);
Chun-Nan Chen, Taipei (TW);
Kuan-Hung Chen, Taipei (TW)

(73) Assignee: Mediatek Inc., Hsin-Chu (TW)

( * ) Notice: Subject to any disclaimer, the term of this patent is extended or adjusted under 35 U.S.C. 154(b) by 734 days.

(21) Appl. No.: 10/250,174

(22) Filed: Jun. 10, 2003

(65) Prior Publication Data

US 2004/0114544 A1    Jun. 17, 2004

(30) Foreign Application Priority Data

Dec. 5, 2002    (TW) ............................... 91135342 A (51) Int. Cl.
*H03H 7/30* (2006.01)

(52) U.S. Cl. ............... 375/232; 370/290; 370/292; 375/232; 375/233; 375/231; 375/316; 375/346; 381/71.11; 708/323

(58) Field of Classification Search ............... 370/290, 370/272; 375/231–233; 381/71.11; 708/323
See application file for complete search history.

(56) References Cited

U.S. PATENT DOCUMENTS

| | | | |
|---|---|---|---|
| 5,511,068 A | | 4/1996 | Sato |
| 5,590,121 A | * | 12/1996 | Geigel et al. ............... 370/290 |
| 6,330,460 B1 | | 12/2001 | Wong et al. |
| 6,337,878 B1 | | 1/2002 | Endres et al. |
| 6,418,164 B1 | | 7/2002 | Endres et al. |
| 6,606,129 B1 | * | 8/2003 | Limberg ..................... 348/614 |
| 7,010,277 B1 | * | 3/2006 | Andre et al. ............. 455/114.2 |
| 2003/0223489 A1 | * | 12/2003 | Smee et al. ................. 375/233 |

OTHER PUBLICATIONS

Y. M. Hasan, et al. Gurber details other applications of CSD system in IEEE Signal Processing Letters, pp. 167-169, 2001.

R. M. Hewlitt, et al. express the filtering coefficient with a Canonical Signed digit (CSD) system and apply the CSD system in the digital FIR filter system in IEEE Workshop on Signal Processing Systems, vol. 8, pp. 416-426, 2000.

Y. C. Lim, et al., express the filter coefficient as serum of signed power-of-two in IEEE Transaction on Circuit and Systems II: Analog and Digital Signal Processing. vol. 46, Issue 5, pp. 577-584, 1999.

* cited by examiner

*Primary Examiner*—Chieh M. Fan
*Assistant Examiner*—Julia Tu
(74) *Attorney, Agent, or Firm*—Winston Hsu (57) ABSTRACT

A linear/non-linear adaptive filter for transforming an input signal to an output signal. The present invention also includes a novel GSPT LMS algorithm for significantly reducing complexity. The adaptive filter includes a coefficient updater that can execute a Carry-in operation or a Borrow-in operation to adaptively adjust a filtering coefficient according to whether an updating term signal is a Carry-in signal or a Borrow-in signal.

33 Claims, 8 Drawing Sheets

ADAPTIVE FILTER WITH GSPT LMS ALGORITHM FOR REDUCING COMPLEXITY

BACKGROUND OF INVENTION

1. Field of the Invention

The invention relates to an adaptive filter and related methods for determining a filtering coefficient, and more particularly, to an adaptive filter operating based on an GSPT LMS Algorithm for adaptively determining the filtering coefficient so as to reduce complexity of the circuit arrangement of the adaptive filter.

2. Description of the Prior Art

With the advent of modern communication standards and the progress of VLSI technology, wireless communication services such as mobile person-to-person communication and indoor wireless network are becoming more and more popular and growing rapidly. Furthermore, wireless communication nowadays is not only confined to lower data rate transmission as the voice service but has also advanced to higher data rate transmission such as the multimedia service. However, with the increase of transmission rate and the enhancement of modulation technique, Inter-symbol interference (ISI) caused by the multi-path fading channel becomes more and more serious. Multi-path fading is a phenomenon in which radio waves are deflected and reflected due to the temperature gradients in the air, the surface of the earth, and the obstacles in the transmission path. The fading phenomenon results in several replicas of the transmitted signal appearing at the receiver end, and those replicas usually arrive at different times because the distance of each path is different. If those replicas span a period that is comparable to or even longer than a symbol period, the receiver might fail to correctly identify the transmitted signals. Therefore, it is necessary to install an adaptive filter in the wireless communication system to erase the interference effect so as to ensure the transmission quality.

Nowadays, the adaptive filter is widely used in various ways. Regarding wireless communication applications, for instance, the adaptive filter is used as the adaptive equalizer in the receiver of the wireless communication system. In U.S. Pat. No. 5,511,068, Sato et al. teach a mobile communication system with installed adaptive equalizers capable of transmitting and receiving a radio signal obtained by TDMA and CDMA without interference. Additionally, Wong et al. disclose an adaptive antenna array in the base station of the wireless network according to the concept of the adaptive filter in U.S. Pat. No. 6,330,460, "Simultaneous forward link beam forming and learning method for mobile high rate data traffic". Besides being applied to the wireless communication system, the adaptive filter can be used in an active noise control for speakers.

As previously mentioned, the adaptive filter is widely used in the present wireless communication systems and noise-control modules. Considering the operating principles of the adaptive filter, one of the most acknowledged and popular adaptive algorithms is Least Mean Square(LMS) algorithm. Regarding the operating efficiency and performance, LMS algorithm has lower convergence speed comparing to other adaptive algorithms, that is, the adaptive filter based on LMS algorithm may erase ISI more slowly. On the other hand, the simple structure of LMS algorithm is suitable for hardware accomplishment and circuit arrangement. However, considering the trend of state-of-the-art VLSI circuit designing, due to that the users desire compact and low-power electronic devices, even LMS algorithm are too complicated for the circuit designers to implement because LMS algorithm requires multiplication. Therefore, the simplification of the operations of the adaptive filter becomes one of the most important issues in the industrial and academic circles.

In the general finite impulse response filter (FIR filter), multipliers are inevitable due to that general algorithms require multiplications. For significantly reducing the filter complexity, a well-known approach is to express the filter coefficient as sum of signed power-of-two (SPT). According to SPT method, the multiplication with SPT number can be achieved by only several shifters and adders, and the filter with SPT number is so-called 2PFIR filter(Powers-of-Two FIR filter or multiplierless FIR Filter). The above-mentioned concepts and methods related to complexity reduction of the filter algorithms are described in many journal papers or letters. For instance, Y. C. Lim et al. express the filter coefficient as sum of signed power-of-two in IEEE Transaction on Circuits and Systems II: Analog and Digital Signal Processing, Vol. 46, Issue 5, pp. 577-584, 1999. The resulting filter requires no general-purpose multiplier for multiplications and thus saves the chip area. R. M. Hewlitt et al. express the filtering coefficient with a Canonical Signed digit (CSD) system and apply the CSD system in the digital FIR filter system in IEEE Workshop on Signal Processing Systems, Vol. 8, pp. 414-426, 2000. In addition, Y. M. Hasan et al. further details other applications of CSD system in IEEE Signal Processing Letters, pp. 167-16, 2001.

As for applying both of SPT method and LMS algorithm to the adaptive filter, we can find related information in many documents and patents. C. L. Chen et al. disclose the way to adaptively adjust the filtering coefficient of the adaptive filter by SPT method and LMS algorithm in Proceedings of IEEE ISCAS-96, pp. 364-367, 1996. In U.S. Pat. No. 6,337,878, "Adaptive equalizer with decision directed constant modulus algorithm", Endres et al. utilize a Constant Modulus Algorithm (CMA) to adaptively adjust the filtering coefficient of the adaptive equalizer combined with SPT method. CMA representation, which can be treated as an advanced LMS algorithm, pre-estimates the error value by a pre-determined table that takes various conditions into consideration for accurately estimating the error value and for raising the convergence speed. Moreover, in U.S. Pat. No. 6,418,164, "Adaptive equalizer with enhanced error quantization", Endres et al. improve the above-mentioned CMA representation and enhance the pre-determined table for adaptively adjusting the filtering coefficient of the adaptive equalizer in the receiver end.

Generally speaking, the quality of the adaptive filter can rely on both the convergence speed and the residual error. Although the above-mentioned prior arts have contributed to the simplification of the operations of the adaptive filter, we find that the prior art still leaves lots of space for improvement regarding sufficiently reducing the system complexity. Moreover, most of the prior art cannot take care of both the convergence speed and the residual error while reducing the system complexity. Since the requirement of performance in a communication system may alter according to different situations, each of the above-mentioned prior art that only aims at certain improvement cannot cover the actual demands in a wireless communication system.

SUMMARY OF INVENTION

It is therefore a primary objective of the claimed invention to provide an adaptive filter with a novel GSPT LMS algorithm for reducing the complexity and to solve the above-mentioned problems.

In the claimed invention, a novel GSPT LMS algorithm and its architecture design for low-complexity adaptive filters are proposed. The GSPT LMS algorithm is based on the conventional LMS algorithm and employs a new Group Signed Power-of-Two (GSPT) representation. When implemented in hardware, the GSPT LMS algorithm disclosed by the claimed invention can sufficiently reduce the hardware complexity without the needs of multipliers. In addition, the claimed invention can cover various demands by adding a little variation to the fundamental GSPT LMS algorithm.

According to the claimed invention, an adaptive filter comprises a feed-forward filter for providing a filtering coefficient to filter an input signal and to output an output signal wherein the filtering coefficient is a sum of power-of-two, and an adaptive module electrically connected to the feed-forward filter for adaptively adjusting the filtering coefficient of the feed-forward filter according to a GSPT LMS algorithm. The adaptive module comprises an error detector for receiving a desired signal and the output signal to output an error signal, an updating term decision module electrically connected to the error detector for receiving the error signal and the input signal to output an updating term signal wherein the updating term signal is a Carry-in signal or a Borrow-in signal, and a coefficient updater electrically connected to the updating term decision module for receiving the updating term signal to output an updated filtering coefficient to the feed-forward filter. When the updating term signal is the Carry-in signal, the coefficient updater executes a Carry-in operation for updating the filtering coefficient; when the updating term signal is the Borrow-in signal, the coefficient updater executes a Borrow-in operation for updating the filtering coefficient; when the updating term decision module does not output any signal, the coefficient updater does not update the filtering coefficient.

The claimed invention provides a method for adaptively updating a filtering coefficient of an adaptive filter. The filtering coefficient is a sum of power-of-two, and the adaptive filter comprises a feed-forward filter, an error detector, an updating term decision module, and a coefficient updater, and the coefficient updater comprising a plurality of updating units. The method comprises utilizing the feed-forward filter to filter an input signal and to output an output signal; utilizing the error detector to receive a desired signal and the output signal for outputting an error signal; utilizing the updating term decision module to receive the error signal and the input signal to output an updating term signal to the coefficient updater, wherein the updating term decision module multiplies the error signal and the input signal and then outputs a corresponding updating term signal to the coefficient updater according to a multiplied value; separating the filtering coefficient into a plurality of groups of digital data, and each group of digital data comprising a plurality of bits of the filtering coefficient, and each group of digital data including at most a signed digit whose value is non-zero, wherein each updating unit of the coefficient updater corresponds to a group of digital data of the filtering coefficient; utilizing the coefficient updater to receive the updating term signal; and utilizing a plurality of the updating units to deal with a plurality of groups of digital data for outputting an updated filtering coefficient to the feed-forward filter.

According to the claimed invention, an adaptive filter comprises a feed-forward filter for providing a filtering coefficient to filter an input signal and to output an output signal wherein the filtering coefficient is a sum of power-of-two and comprises a plurality of groups of digital data, and each group of digital data comprises a plurality of bits of the filtering coefficient and includes at most a signed digit whose value is non-zero; an error detector for receiving a desired signal and the output signal to output an error signal; an updating term decision module electrically connected to the error detector for receiving the error signal and the input signal to output an updating term signal wherein the updating term signal is a Carry-in signal or a Borrow-in signal; and a coefficient updater electrically connected to the updating term decision module for receiving the updating term signal to output an updated filtering coefficient to the feed-forward filter, and the coefficient updater comprising a plurality of updating units, wherein quantities of the updating units are slightly larger than quantities of the groups of digital data, wherein the excess updating units compared with quantities of the groups of digital data can be used to deal with the newly added groups of the least significant bits (LSB) of the filtering coefficient, and each of the additional updating units corresponds to a group of digital data of the filtering coefficient for dealing with the group of digital data. When the updating term signal is the Carry-in signal, the updating units corresponding to the groups of LSB execute Carry-in operations for updating the filtering coefficient. When the updating term signal is the Borrow-in signal, the updating units corresponding to the groups of LSB execute Borrow-in operations for updating the filtering coefficient. When the updating term decision module does not output any signal, the coefficient updater does not update the filtering coefficient, wherein the updated filtering coefficient to be transmitted to the feed-forward filter does not comprise the newly added groups of LSB.

The claimed invention provides a method for adaptively updating a filtering coefficient of an adaptive filter, the filtering coefficient being a sum of powers-of-two, the adaptive filter comprising a feed-forward filter, an error detector, an updating term decision module, and a coefficient updater, the coefficient updater comprising a plurality of updating units. The method comprises utilizing the feed-forward filter to filter an input signal and to output an output signal, utilizing the error detector to receive a desired signal and the output signal for outputting an error signal, and utilizing the updating term decision module to receive the error signal and the input signal to output an updating term signal to the coefficient updater, wherein the updating term decision module multiplies the error signal and the input signal and then outputs a corresponding updating term signal to the coefficient updater according to a multiplied value. When the multiplied value is greater than zero, the updating term signal is a Carry-in signal; when the multiplied value is less than zero, the updating term signal is a Borrow-in signal; when the multiplied value is equal to zero, the updating term decision module does not output the updating term signal. The method further comprises separating the filtering coefficient into a plurality of groups of digital data, each group of digital data comprising a plurality of bits of the filtering coefficient and each group of digital data including at most a signed digit whose value is non-zero, wherein quantities of the updating units are slightly larger than quantities of the groups of digital data, the excess updating units compared with quantities of the groups of digital data can be used to deal with newly added groups of the least significant bits (LSB) of the filtering coefficient and each of the additional updating units corresponds to a group of digital data of the filtering coefficient for dealing with the group of digital data; utilizing the coefficient updater to receive the updating term signal, wherein when the updating term signal is the Carry-in signal, the updating units corresponding to the groups of LSB execute Carry-in operations for updating the filtering coefficient, when the updating term signal is the Borrow-in signal, the updating units corresponding to the groups of LSB execute Borrow-in operations for updating the filtering coefficient, when the updating term decision module does not output any signal, the coefficient updater does not update the filtering coefficient; and utilizing the coefficient updater to output an updated filtering coefficient to the feed-forward filter.

These and other objectives of the present invention will no doubt become obvious to those of ordinary skill in the art after reading the following detailed description of the preferred embodiment, which is illustrated in the various figures and drawings.

DETAILED DESCRIPTION

Figure 1:
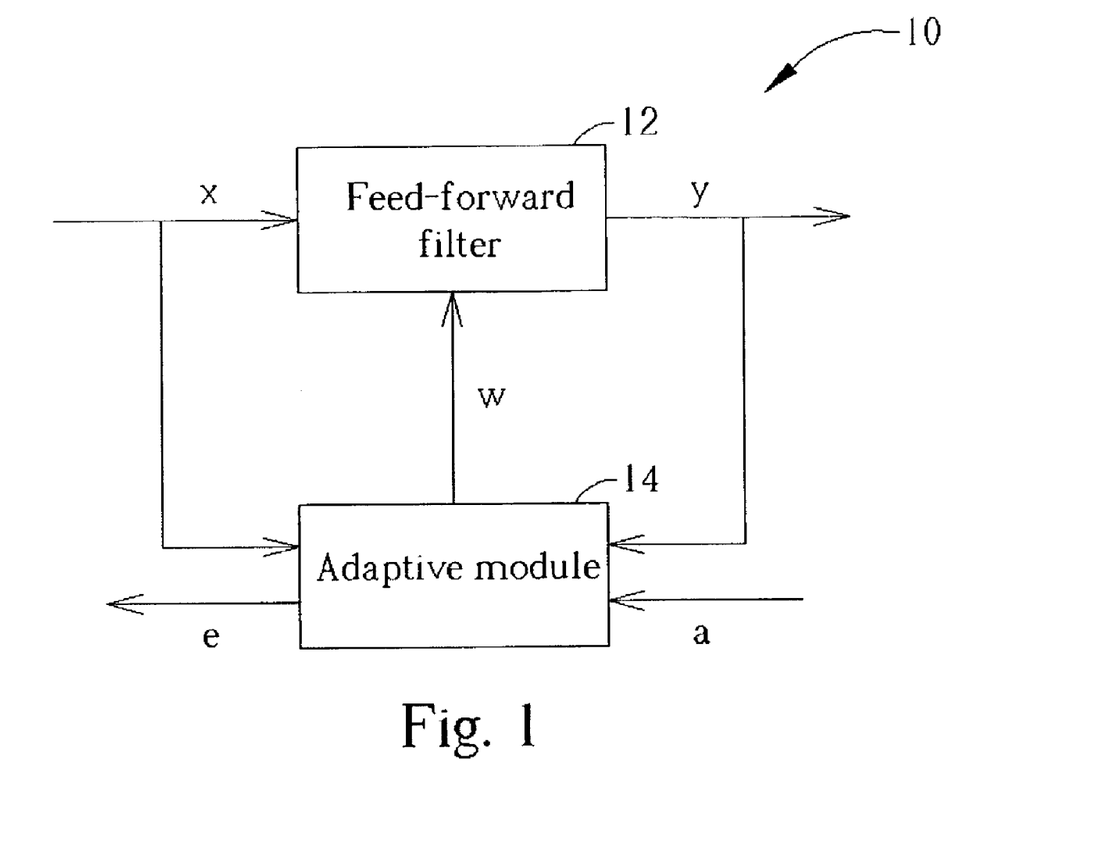
FIG. 1 is a functional block diagram of an adaptive filter according to the present invention.

Please refer to FIG. 1, which is a schematic diagram of function blocks for an embodiment of adaptive filter_10 according to present invention. The adaptive_filter 10 includes a feed-forward filter 12 and an adaptive module 14 electrically connected to the feed-forward filter 12. According to the basic structure of the adaptive filter_10 as shown in FIG. 1, the adaptive filter_10 utilizes the adaptive module 14 based on a novel adaptive algorithm of the present invention to adaptively adjust the filtering coefficient of the feed-forward filter 12 for erasing ISI. As shown in FIG. 1, after the feed-forward filter 12 receives an input signal x and the adaptive module 14 receives the input signal x, the feed-forward filter 12 outputs an output signal y corresponding to the input signal x. After that, the adaptive module 14 receives the output signal y. In addition, the adaptive module 14 also receives a desired signal a, and the adaptive module 14 operates the output signal y and desired signal a to output an error e for providing advanced operations. At last, the adaptive module 14 generates an updated filtering coefficient w to the feed-forward filter 12 for achieving one-time coefficient-updating operation. After an input signal x is received, the above-mentioned coefficient-updating operation will be repeated till the output signal y is almost equivalent to the desired signal a. After the next input signal x is received, the operation will be aroused and repeated again so that the adaptive filter_10 can adaptively adjust the filtering coefficient w of the feed-forward filter 12.

Figure 2:
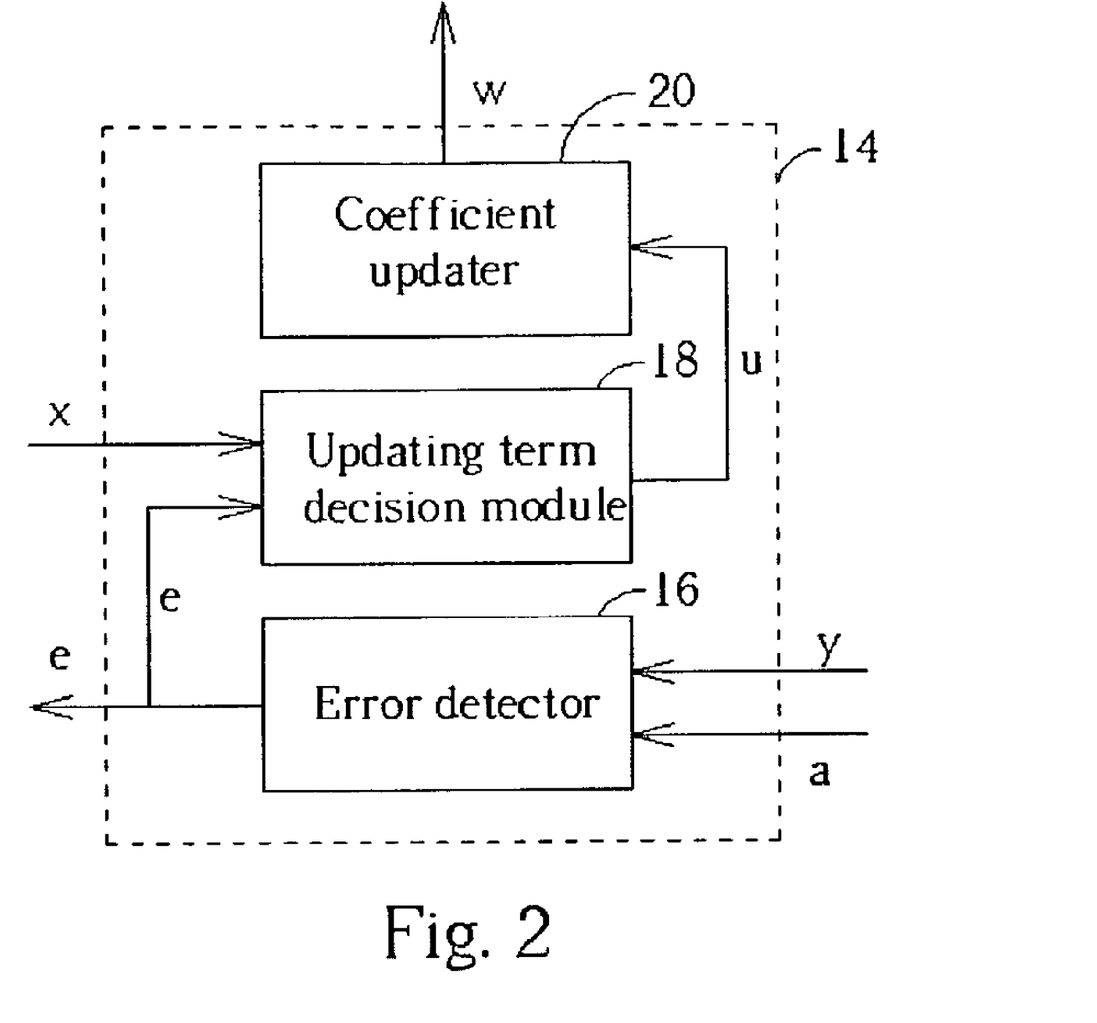
FIG. 2 is a functional block diagram of an adaptive module of the adaptive filter as shown in FIG. 1.
Figure 3:
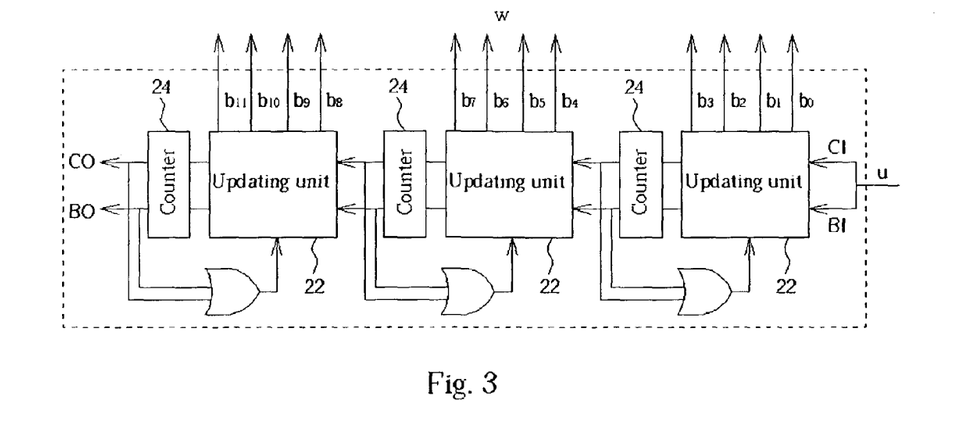
FIG. 3 is a schematic diagram of the first embodiment of a coefficient updater as shown in FIG. 2.

According to the above description, the adaptive module 14 of the embodiment of the adaptive filter 10 is known to be a critical component for adaptively adjusting the filtering coefficient w. Please refer to FIG. 2, which is a detailed schematic diagram of function blocks for an embodiment of the adaptive module 14 as shown in FIG. 1. The adaptive module 14 comprises an error detector 16, an updating term decision module 18, and a coefficient updater 20. Combined with FIG. 1, the error detector 16 is used to receive the desired signal and the output signal y, and then to generate the error e by subtracting the output signal y from the desired signal a. Afterwards, the updating term decision module 18 electrically connected to the error detector 16 can be used to receive the error e and the input signal x for outputting an updating term signal u. Finally, the coefficient updater 20 electrically connected to the updating term decision module 18 is used to receive the updating term signal u for outputting an updated filtering coefficient w to the feed-forward filter 12. Please refer to FIG. 3, which is a schematic diagram of an embodiment of the coefficient updater 20 as shown in FIG. 2. The coefficient updater 20 includes a plurality of updating units 22. As shown in FIG. 3, the filtering coefficient w is set as 12-bit digital data b0~b11, and the coefficient updater 20 includes three cascaded updating units 22. That is, each updating unit 22 corresponds to a set of 4-bit digital data of the filtering coefficient w for dealing with the set of 4-bit digital data. The above-mentioned concept is based on a novel number representation that will be detailed in the next paragraph. Please continue referring to FIG. 3, the updating unit 22 will output the updated 12-bit (b0~b11) filtering coefficient w to the feed-forward filter 12 as shown in FIG. 1. In addition, each updating unit 22 is connected to a counter 24 as shown in FIG. 3. Each counter 24 can be used as a buffer between adjacent updating units 22 for reducing the fluctuations on filtering coefficient caused by noise.

After introducing the fundamental structure of the adaptive filter_10 (as shown in FIG. 1) according to the present invention, a novel adaptive algorithm, GSPT LMS, shall be disclosed for completely realizing the operations and characteristics of the adaptive filter 10. Besides, the perfect combination between the novel adaptive algorithm (GSPT LMS) and related hardware implementation will be disclosed. First, the novel adaptive algorithm (GSPT LMS) is based on a novel Grouped Signed Power-of-Two representation, GSPT representation, which is also disclosed in the present invention, and on the conventional LMS algorithm. Therefore, the novel adaptive algorithm of the present invention is named as GSPT LMS. The GSPT representation inherits the basic concept of expressing the filter coefficient as sum of signed power-of-two from the conventional SPT representation. The GSPT representation also inherits the characteristics of expressing the filter coefficient with a signed digit system for further simplifying the filtering coefficient. In addition to some conventional advantages, the GSPT representation raises a concept of "grouping the filtering coefficient". Briefly speaking, the GSPT representation divides the filtering coefficient w into several groups of digital data, and each group of digital data includes a plurality of bits of filtering coefficient w. Furthermore, each group of digital data includes at most a signed digit whose value is non-zero, and the value of the signed digit can be +1, −1, or 0. For instance, if we set the filtering coefficient w as a 12-bit digital data b0~b11 (as the condition described in FIG. 3), the GSPT representation of the present invention can previously divide the 12-bit filtering coefficient w into three groups. Please notice that the quantities of groups should not be limited. As shown in FIG. 3, each group of digital data of the filtering coefficient w contains 4 bits, and the 12-bit filtering coefficient w arranged from the most significant bit (MSB) to the least significant bit (LSB) is described as follows:

$b_{11}b_{10}b_9b_8b_7b_6b_5b_4b_3b_2b_1b_0$

As the above-shown filtering coefficient w (b11~b0), each group of digital data includes at most a signed digit whose value is +1 or −1. For instance, "449" can be expressed as 0010 0$\bar{1}$00 0001, and thus the three non-zero signed digits in three groups of 4-bit digital data are respectively 1, $\bar{1}$, 1, namely 1, −1, 1. With the novel characteristic, the GSPT representation can significantly reduce the system complexity. Please refer to the embodiment as shown in FIG. 3. Combined with the hardware implementation, the three updating units 22 of the coefficient updater 20 are respectively corresponding to the above-mentioned three groups of 4-bit digital data of the filtering coefficient w. That is, in the embodiment as shown in FIG. 3, the quantities of divided groups of the filtering coefficient w are the same as the quantities of the updating units 22, and thus each updating unit 22 is used for dealing with the corresponding group of digital data.

Afterwards, based on the novel GSPT representation and the conventional LMS algorithm, the principles of the novel GSPT LMS of the present invention are as follows. First, please refer to FIG. 2 and FIG. 3, after the error detector 16 receives the desired signal a and the output signal y, the error e can be calculated by subtracting the output signal y from the desired signal a. After that, the updating term decision module 18 receives the calculated error e and the input signal x, multiplies the error e by the input signal x, and then outputs a corresponding updating term signal w depending on the multiplied value according to a judgment equation. The judgment equation is described as follows:

$$W_{k+1} = \begin{cases} W_k^+ & \text{if } e_k * x_k > 0 \\ W_k & \text{if } e_k * x_k = 0 \\ W_k^- & \text{if } e_k * x_k < 0 \end{cases} \quad \text{(Eq. 1)}$$

The parameters with index "k" represent that those parameters are being operated and not being updated, and the parameters with index "k+1" represent that those parameters are updated. Therefore, $W_k$ and $W_{k+1}$ respectively represent non-updated filtering coefficient w and once-updated filtering coefficient w. In Eq. 1, $W_k$+ represents a value slightly larger than $W_k$ and $W_k$− represents a value slightly smaller than $W_k$. Theoretically, from Eq. 1, the novel adaptive algorithm, GSPT LMS, of the present invention only judges that the multiplied value between the error e and the input signal x is either negative or positive to decide either to increase the filtering coefficient w or to decrease the filtering coefficient w. Please continue referring to FIG. 3, which shows that the updating term signal u includes a Carry-in signal CI and a Borrow-in signal BI. When the multiplied value of the error e and the input signal x is larger than zero, the updating term signal u is set as the Carry-in signal CI, which corresponds to the operator "+" as shown in Eq. 1. Therefore, the filtering coefficient w will be increased. When the multiplied value between the error e and the input signal x is less than zero, the updating term signal u is set as the Borrow-in signal BI, which corresponds to the operator "−" as shown in Eq. 1. Therefore, the filtering coefficient w will be decreased. When the multiplied value is equal to zero, the updating term decision module 18 does not output the updating term signal u.

Figure 4:
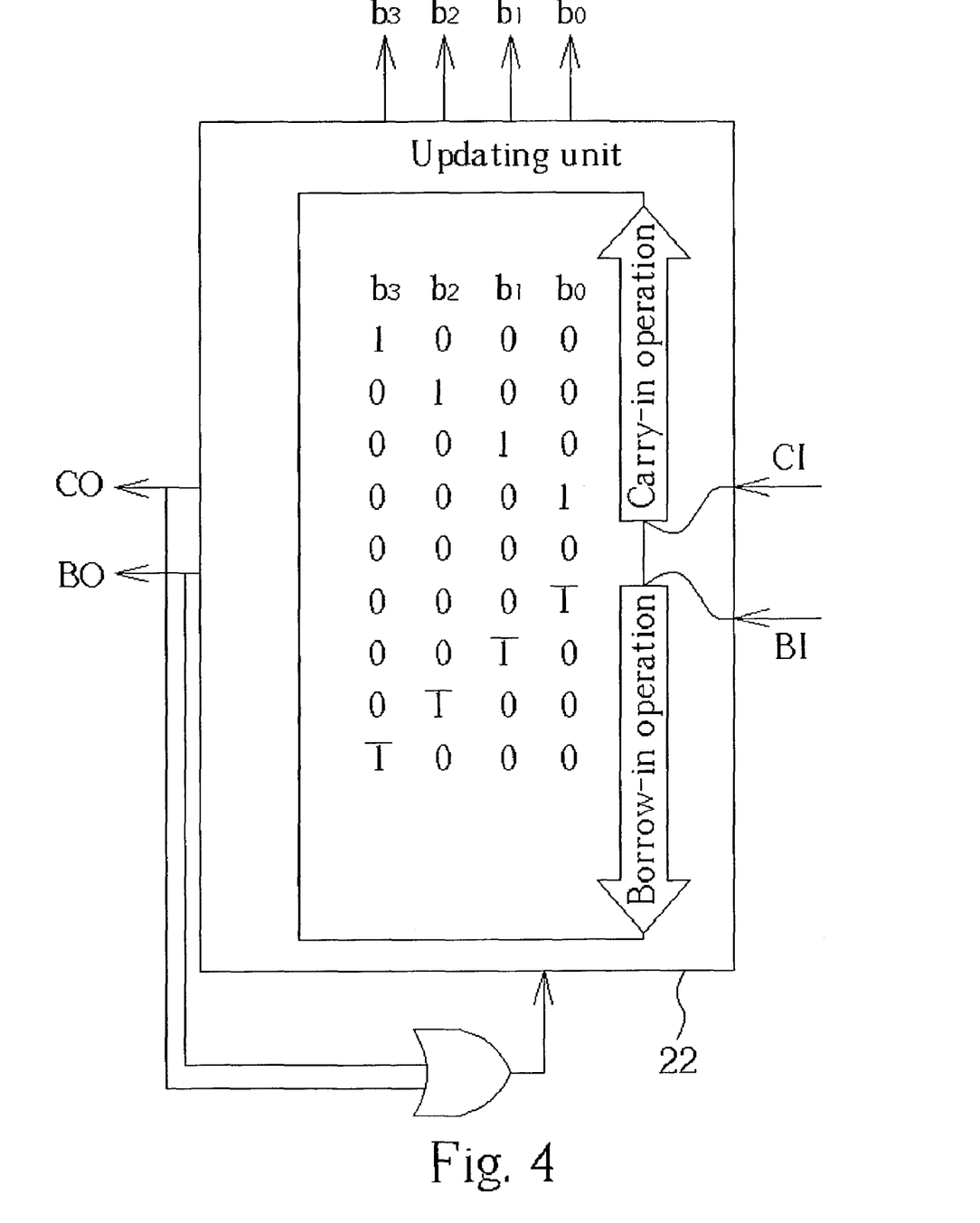
FIG. 4 is a schematic diagram showing operation in an updating unit as shown in FIG. 3.

For detailing the operations of the GSPT LMS in each updating unit 22, please refer to FIG. 4, which is a schematic diagram showing the operations in an updating unit 22 as shown in FIG. 3. The updating unit 22 deals with a group of 4-bit digital data, which is the LSB b0~b3 of the filtering coefficient w (b0~b11). Please notice that another two updating units 22 dealing with two additional groups of 4-bit digital data, b4~b7 and b8~b11, as shown in FIG. 3 operate in the same way as the updating unit 22 does as shown in FIG. 4. When the updating term signal u received by the updating unit 22 is the Carry-in signal CI, the updating unit 22 executes a Carry-in operation to update the 4-bit digital data b0~b3 of the filtering coefficient w. When the updating term signal u is the Borrow-in signal BI, the updating unit 22 executes a Borrow-in operation to update the 4-bit digital data b0~b3 of the filtering coefficient w. When the updating term decision module 18 does not output any signal, the updating unit 22 does not alter the 4-bit digital data b0~b3 of the filtering coefficient w. Please refer to FIG. 3 and FIG. 4. When the 4-bit digital data b0~b3 as shown in FIG. 4 continue to execute the Carry-in operation by receiving the Carry-in signal CI so that the four bits (b3b2b1b0) become (1000), any additional Carry-in signal CI received by the updating unit 22 will make the updating unit 22 output a Carry-out signal CO to the next updating unit 22 dealing with the next 4-bit digital data b4~b7 as shown in FIG. 3. The Carry-out signal CO can be treated as the Carry-in signal CI for the next updating unit 22 dealing with the next 4-bit digital data b4~b7. Meanwhile, the four bits (b3b2b1b0) processed in the updating unit 22 will return to (0000) from (1000). Similarly, When the 4-bit digital data b0~b3 as shown in FIG. 4 continue to executes the Borrow-in operation by receiving the Borrow-in signal BI so that the four bits (b3b2b1b0) become (−1000), any additional Borrow-in signal BI received by the updating unit 22 will make the updating unit 22 output a Borrow-out signal BO to the next updating unit 22 dealing with the next 4-bit digital data b4~b7 as shown in FIG. 3. The Borrow-out signal BO can be treated as the Borrow-in signal BI for the next updating unit 22 dealing with the next 4-bit digital data b4~b7. Meanwhile, the four bits (b3b2b1b0) processed in the updating unit 22 will return to (0000) from (−1000). Moreover, each counter 24 connected to each updating unit 22 can be used as a buffer for the adjacent updating units 22 to reduce the fluctuations on filtering coefficient caused by noise.

The above-mentioned embodiment of the adaptive filter requires no multipliers for hardware implementation and circuit arrangement due to the characteristic of the novel GSPT LMS according to the present invention. Therefore, the hardware complexity can be significantly reduced.

Moreover, since the residual error or convergence speed of the adaptive filters may be the most important concern in some specific applications, the present invention can cover various demands in wireless communication systems by only adding a little modification. Some improved embodiments are thus disclosed to improve the performance of the above-mentioned embodiment for industrial designers to choose the most suitable embodiment in different cases. Please notice that most modifications lie in the coefficient updater 20 as shown in FIG. 2. First, please refer to FIG. 5, which is a schematic diagram showing the coefficient updater 20 added with a multiplexer (MUX) 26. All the components in FIG. 5 operate in the same way as those in FIG. 1 to FIG. 4. Thus, in the embodiment as shown in FIG.

Figure 5:
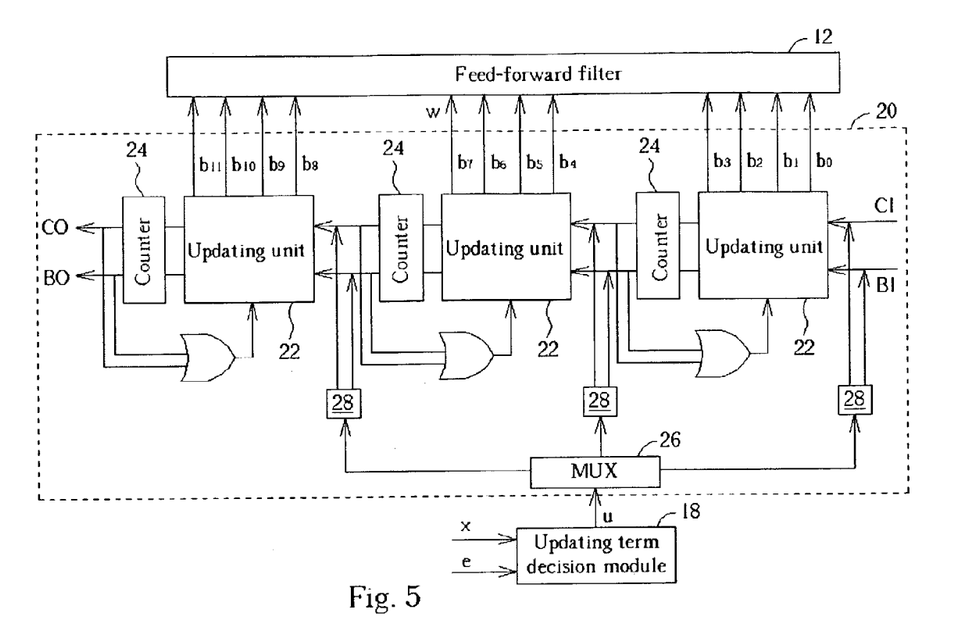
FIG. 5 is a schematic diagram of the second embodiment of the coefficient updater as shown in FIG. 2.

5, the feed-forward filter 12 is still utilized for filtering an input signal x and then outputting an output signal y, and the error detector 16 is used to receive a desired signal a and the output signal y for generating an error e. Afterwards, the updating term decision module 18 receives and multiplies the error e and the input signal x for generating and transmitting an updating term signal u to the coefficient updater 20. In addition, in the present embodiment, the filtering coefficient w is also set as 12-bit digital data and divided into three groups according to the GSPT representation of the present invention. Each group of digital data includes four bits of the filtering coefficient w, and each group of 4-bit digital data at most includes a signed digit whose value is not zero.

The main difference between the present embodiment as shown in FIG. 5 and the previous embodiment is that the MUX 26 is included in the present embodiment. The MUX 26 is electrically connected between the updating term decision module 18 and the coefficient updater 20. Otherwise the MUX 26 can be treated as part of the coefficient updater 20. The MUX 26 is used for receiving the updating term signal u from the updating term decision module 18 and choosing the updating term signal u to the appropriate updating unit 22. Afterwards, a plurality of branch MUXs 28, which correspond to the plurality of updating units 22, will select the updating term signal u either from the MUX 26 or from the previous updating unit, and thus the Carry-in or Borrow-in operation can be executed to update the filtering coefficient w. Therefore, the present embodiment can utilize the MUX 26 to judge which group of digital data of the filtering coefficient w the received updating term signal u should correspond to. After the MUX 26 judges the appropriate group of digital data to be adjusted, the updating term signal u and the related operation will be applied to the updating unit 22 that corresponds to the group of digital data to be adjusted. Compared with the previous embodiment that operates adjustment from the LSB, the present embodiment as shown in FIG. 5 can significantly improve the convergence speed.

Figure 6:
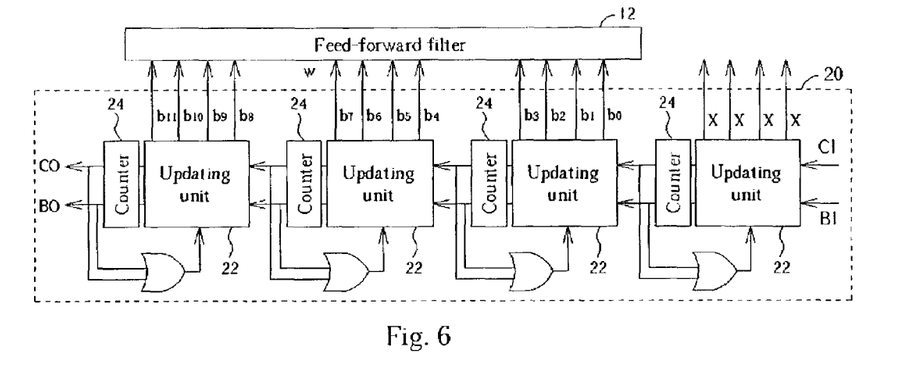
FIG. 6 is a schematic diagram of the third embodiment of the coefficient updater as shown in FIG. 2.

The next embodiment is accuracy-oriented by adding an additional updating unit 22 in the coefficient updater 20 as shown in FIG. 2. Please refer to FIG. 6, which is a schematic diagram of another improved embodiment according to the present invention. Please notice that the quantities of the updating units 22 in the coefficient updater 20 as shown in FIG. 6 are slightly larger than the quantities of the groups of digital data. That is, the coefficient updater 20 includes four updating units 22 in the present embodiment as shown in FIG. 6 while the filtering coefficient w is still set as 12-bit digital data and divided into three groups according to the GSPT representation of the present invention. The excess updating unit 22 compared with quantities of groups of digital data can be used to deal with a newly added group of LSB of the filtering coefficient w, and each of the additional updating units 22 still corresponds to a group of digital data of the filtering coefficient w for dealing with the group of digital data as the all the above-mentioned embodiments do. Please notice that, first, the bit-number of the newly added group of LSB of the filtering coefficient w should not be limited. When implemented in hardware, the bit-number of the newly added group of LSB can be "four" as shown in FIG. 6 or others. Second, the quantities of the newly added groups and the quantities of the newly added corresponding updating units 22 should not be limited. Actually, the updated filtering coefficient w that is transmitted to the feed-forward filter 12 does not include the newly added group of LSB. As shown in FIG. 6, the newly added group of LSB processed by the newly added updating unit 22 is just used for decreasing the implicit step size so as to reduce the residual error. Real filtering coefficient w does not contain the newly added group of LSB, which is thus not transmitted to the feed-forward filter 12. The present embodiment as shown in FIG. 6 with the newly added group of LSB and the corresponding additional updating unit 22 can increase the accuracy during the coefficient-adjustment process.

Figure 7:
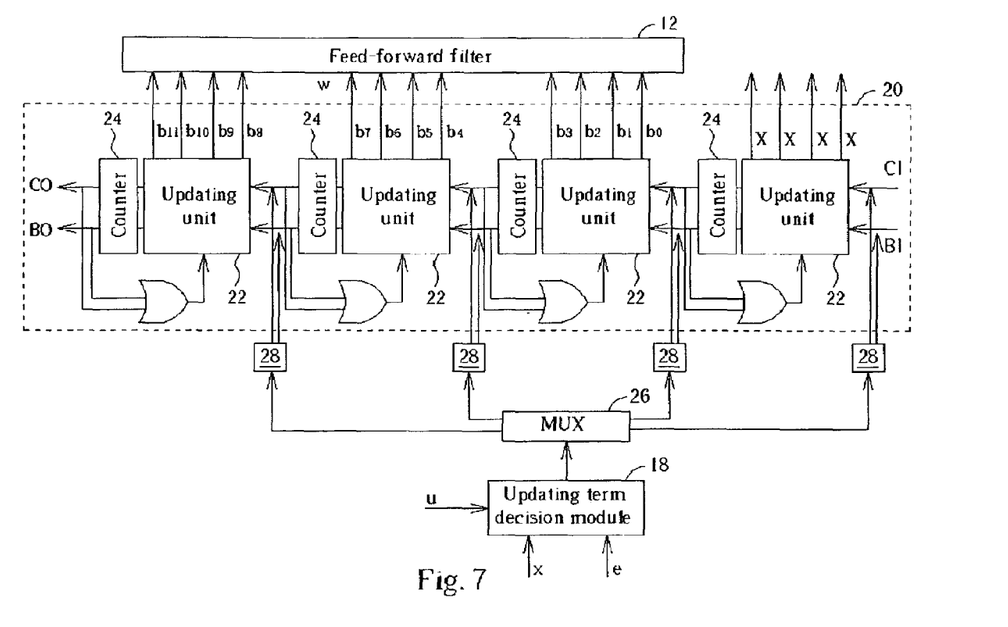
FIG. 7 is a schematic diagram of the fourth embodiment of the coefficient updater as shown in FIG. 2.
Figure 8:
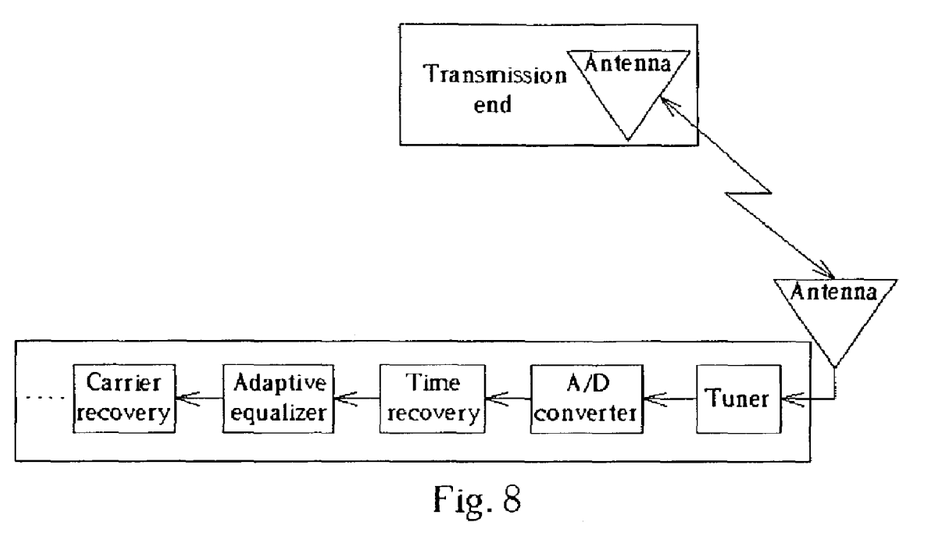
FIG. 8 is a schematic diagram showing the adaptive filter of the present invention being used as an adaptive equalizer in a receiver in a wireless communication system.

It is well known that residual error and convergence speed must be a trade-off. By properly combining the embodiment as shown in FIG. 5 and the embodiment as shown in FIG. 6, we can reach a great balance between the residual error and the convergence speed. Please refer to FIG. 7, which is a schematic diagram showing the coefficient updater 20 as shown in FIG. 5 added with additional updating unit 22 and corresponding additional branch MUX 28. The embodiment as shown in FIG. 7 can also be viewed as the coefficient updater 20 as shown in FIG. 6 added with a MUX 26 and a plurality of branch MUXs 28. The embodiment as shown in FIG. 7 can reach a balance between the accuracy and the convergence speed without increasing the system complexity. The above-mentioned adaptive filter 10 can be used as an adaptive equalizer, an adaptive beam-former, and an interference canceller in a wireless communications system. Please refer to FIG. 8, which is a schematic diagram showing the adaptive filter 10 being used as an adaptive equalizer in a receiver in a wireless communication system. Due to the Inter-symbol interference (ISI) caused by the multi-path fading channel, the receiver end requires an adaptive equalizer to ensure the quality of signals. All the above-mentioned embodiments related to the adaptive filter 10 of the present invention can be applied to the adaptive equalizer as shown in FIG. 8. In addition, the novel LMS algorithm disclosed in the present invention can be applied to an adaptive equalizer of a receiver, to an adaptive antenna of a base station, and to another wireless communications system based on the GSPT LMS algorithm.

In the present invention, a novel adaptive filter with low complexity and related operating algorithms are disclosed. First, the present invention discloses a novel GSPT LMS algorithm based on a novel GSPT representation and conventional LMS algorithm. For hardware implementation and circuit arrangement, the adaptive filter operating according to the novel GSPT LMS algorithm requires no multiplier so as to significantly reduce the complexity. Besides, since the requirement of performance in a wireless communication system may alter according to different situations, the embodiments of the present invention can provide the best solution among those various demands.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An adaptive filter, the adaptive filter comprising:
a feed-forward filter for providing a filtering coefficient to filter an input signal and to output an output signal, wherein the filtering coefficient is a sum of power-of-two; and
an adaptive module electrically connected to the feed-forward filter for adaptively adjusting the filtering coefficient of the feed-forward filter according to a

Group Signed Power of Two (GSPT) Least Mean Square (LMS) algorithm, the adaptive module comprising:
an error detector for receiving a desired signal and the output signal to output an error signal;
an updating term decision module electrically connected to the error detector for receiving the error signal and the input signal to output an updating term signal, wherein the updating term signal is a Carry-in signal or a Borrow-in signal; and
a coefficient updater electrically connected to the updating term decision module for receiving the updating term signal to output an updated filtering coefficient to the feed-forward filter;
wherein when the updating term signal is the Carry-in signal, the coefficient updater executes a Carry-in operation for updating the filtering coefficient; when the updating term signal is the Borrow-in signal, the coefficient updater executes a Borrow-in operation for updating the filtering coefficient; when the updating term decision module does not output any signal, the coefficient updater does not update the filtering coefficient.

2. The adaptive filter of claim 1, wherein the GSPT LMS algorithm makes use of a Group Signed Power-of-two (GSPT) representation that describes the filtering coefficient as a sum of power-of-two and separates the filtering coefficient into a plurality of groups of digital data and an LMS algorithm to adaptively adjust the filtering coefficient of the feed-forward filter, wherein according to the GSPT representation, each group of digital data comprises a plurality of bits of the filtering coefficient, and each group of digital data includes at most a signed digit whose value is non-zero.

3. The adaptive filter of claim 2, wherein in each group of digital data, the value of the signed digit can be +1, or −1.

4. The adaptive filter of claim 2, wherein the coefficient updater further comprises a plurality of updating units, and each updating unit corresponds to a group of digital data of the filtering coefficient for dealing with the group of digital data.

5. The adaptive filter of claim 4, wherein the adaptive module further comprises a multiplexer (MUX) that is electrically connected between the updating term decision module and the coefficient updater for receiving the updating term signal from the updating term decision module and delivers the updating term signal to the corresponding updating unit for updating the filtering coefficient.

6. The adaptive filter of claim 1, wherein the error signal is generated by subtracting the output signal from the desired signal.

7. The adaptive filter of claim 1, wherein the updating term decision module multiplies the error signal with the input signal and then outputs a corresponding updating term signal to the coefficient updater according to a multiplied value, wherein when the multiplied value is greater than zero, the updating term signal is the Carry-in signal; when the multiplied value is less than zero, the updating term signal is the Borrow-in signal; when the multiplied value is equal to zero, the updating term decision module does not output the updating term signal.

8. The adaptive filter of claim 1 being used in an adaptive equalizer, an adaptive beam-former, and an interference canceller in a wireless communications system.

9. The adaptive filter of claim 1, wherein the GSPT LMS algorithm is applied to an adaptive equalizer of a receiver, to an adaptive antenna of a base station, and to another wireless communications system based on the GSPT LMS algorithm.

10. A method for adaptively updating a filtering coefficient of an adaptive filter, the filtering coefficient being a sum of power-of-two, the adaptive filter comprising a feed-forward filter, an error detector, an updating term decision module, and a coefficient updater, the coefficient updater comprising a plurality of updating units, the method comprising:
utilizing the feed-forward filter to filter an input signal and to output an output signal;
utilizing the error detector to receive a desired signal and the output signal for outputting an error signal;
utilizing the updating term decision module to receive the error signal and the input signal to output an updating term signal to the coefficient updater, wherein the updating term decision module multiplies the error signal and the input signal and then outputs a corresponding updating term signal to the coefficient updater according to a multiplied value;
separating the filtering coefficient into a plurality of groups of digital data, each group of digital data comprising a plurality of bits of the filtering coefficient and each group of digital data including at most a signed digit whose value is non-zero, wherein each updating unit of the coefficient updater corresponds to a group of digital data of the filtering coefficient; and
utilizing the coefficient updater to receive the updating term signal and utilizing a plurality of the updating units to deal with a plurality of groups of digital data for outputting an updated filtering coefficient to the feed-forward filter.

11. The method of claim 10, wherein the adaptive module further comprises a multiplexer (MUX) that is electrically connected between the updating term decision module and the coefficient updater for receiving the updating term signal from the updating term decision module and delivers the updating term signal to the corresponding updating unit for updating the filtering coefficient.

12. The method of claim 10 further comprising setting the updating term signal as the Carry-in signal when the multiplied value is greater than zero; setting the updating term signal as the Borrow-in signal when the multiplied value is less than zero; utilizing the updating term decision module not to output the updating term signal when the multiplied value is equal to zero.

13. The method of claim 10 further comprising utilizing the coefficient updater to execute a Carry-in operation for updating the filtering coefficient when the updating term signal is the Carry-in signal; utilizing the coefficient updater to execute a Borrow-in operation for updating the filtering coefficient when the updating term signal is the Borrow-in signal; utilizing the coefficient updater not to update the filtering coefficient when the updating term decision module does not output any signal.

14. The method of claim 10, wherein in each group of digital data, the value of the signed digit can be +1, −1, or 0.

15. The method of claim 10, wherein the error signal is generated by subtracting the output signal from the desired signal.

16. The method of claim 10, wherein the adaptive filter is used in an adaptive equalizer, an adaptive beam-former, and an interference canceller in a wireless communications system.

17. The method of claim 10, wherein the filtering coefficient is adaptively updated according to a GSPT LSM algorithm, and the GSPT LSM algorithm being further applied to an adaptive equalizer of a receiver, an adaptive antenna of a base station, and another wireless communications system based on the GSPT LMS algorithm.

18. The method of claim 10 being used for erasing inter-symbol interference (ISI) in a communications system and for reducing complexity of a system.

19. An adaptive filter, the adaptive filter comprising:
a feed-forward filter for providing a filtering coefficient to filter an input signal and to output an output signal, wherein the filtering coefficient is a sum of power-of-two and comprises a plurality of groups of digital data, each group of digital data comprises a plurality of bits of the filtering coefficient and includes at most a signed digit whose value is non-zero;
an error detector for receiving a desired signal and the output signal to output an error signal;
an updating term decision module electrically connected to the error detector for receiving the error signal and the input signal to output an updating term signal, wherein the updating term signal is a Carry-in signal or a Borrow-in signal; and
a coefficient updater electrically connected to the updating term decision module for receiving the updating term signal to output an updated filtering coefficient to the feed-forward filter, the coefficient updater comprising a plurality of updating units, wherein quantities of the updating units are slightly larger than quantities of the groups of digital data;
wherein the excess updating units compared with quantities of the groups of digital data are used to deal with newly added groups of the least significant bits (LSB) of the filtering coefficient and each of the additional updating units corresponds to a group of digital data of the filtering coefficient for dealing with the group of digital data; when the updating term signal is the Carry-in signal, the updating units corresponding to the groups of LSB execute Carry-in operations for updating the filtering coefficient; when the updating term signal is the Borrow-in signal, the updating units corresponding to the groups of LSB execute Borrow-in operations for updating the filtering coefficient; when the updating term decision module does not output any signal, the coefficient updater does not update the filtering coefficient, wherein the updated filtering coefficient to be transmitted to the feed-forward filter does not comprise the newly added groups of LSB.

20. The adaptive filter of claim 19 further comprising a multiplexer (MUX) that is electrically connected between the updating term decision module and the coefficient updater for receiving the updating term signal from the updating term decision module and delivers the updating term signal to the corresponding updating unit for updating the filtering coefficient.

21. The adaptive filter of claim 19, wherein in each group of digital data, the value of the signed digit can be +1, −1, or 0.

22. The adaptive filter of claim 19, wherein the error signal is generated by subtracting the output signal from the desired signal.

23. The adaptive filter of claim 19, wherein the updating term decision module multiplies the error signal with the input signal and then outputs a corresponding updating term signal to the coefficient updater according to a multiplied value, wherein when the multiplied value is greater than zero, the updating term signal is the Carry-in signal; when the multiplied value is less than zero, the updating term signal is the Borrow-in signal; when the multiplied value is equal to zero, the updating term decision module does not output the updating term signal.

24. The adaptive filter of claim 19 being used in an adaptive equalizer, an adaptive beam-former, and an interference canceller in a wireless communications system.

25. The adaptive filter of claim 19, wherein the filtering coefficient is adaptively updated according to a GSPT LMS algorithm and the GSPT LMS algorithm is applied to an adaptive equalizer of a receiver, to an adaptive antenna of a base station, and to another wireless communications system based on the GSPT LMS algorithm.

26. A method for adaptively updating a filtering coefficient of an adaptive filter, the filtering coefficient being a sum of power-of-two, the adaptive filter comprising a feed-forward filter, an error detector, an updating term decision module, and a coefficient updater, the coefficient updater comprising a plurality of updating units, the method comprising:
utilizing the feed-forward filter to filter an input signal and to output an output signal;
utilizing the error detector to receive a desired signal and the output signal for outputting an error signal;
utilizing the updating term decision module to receive the error signal and the input signal to output an updating term signal to the coefficient updater, wherein the updating term decision module multiplies the error signal and the input signal and then outputs a corresponding updating term signal to the coefficient updater according to a multiplied value; wherein when the multiplied value is greater than zero, the updating term signal is a Carry-in signal; when the multiplied value is less than zero, the updating term signal is a Borrow-in signal; when the multiplied value is equal to zero, the updating term decision module does not output the updating term signal;
separating the filtering coefficient into a plurality of groups of digital data, each group of digital data comprising a plurality of bits of the filtering coefficient and each group of digital data including at most a signed digit whose value is non-zero, wherein quantities of the updating units are slightly larger than quantities of the groups of digital data, the excess updating units compared with quantities of the groups of digital data is used to deal with newly added groups of the least significant bits (LSB) of the filtering coefficient and each of the additional updating units corresponds to a group of digital data of the filtering coefficient for dealing with the group of digital data;
utilizing the coefficient updater to receive the updating term signal, wherein when the updating term signal is the Carry-in signal, the updating units corresponding to the groups of LSB execute Carry-in operations for updating the filtering coefficient; when the updating term signal is the Borrow-in signal, the updating units corresponding to the groups of LSB execute Borrow-in operations for updating the filtering coefficient; when the updating term decision module does not output any signal, the coefficient updater does not update the filtering coefficient; and
utilizing the coefficient updater to output an updated filtering coefficient to the feed-forward filter.

27. The method of claim 26, wherein the adaptive filter further comprises a multiplexer (MUX) that is electrically connected between the updating term decision module and the coefficient updater for receiving the updating term signal from the updating term decision module and delivers the updating term signal to the corresponding updating unit for updating the filtering coefficient.

28. The method of claim 26, wherein the updated filtering coefficient to be transmitted to the feed-forward filter does not comprise the newly added groups of LSB.

29. The method of claim 26, wherein in each group of digital data, the value of the signed digit can be +1, −1, or 0.

30. The method of claim 26, wherein the error signal is generated by subtracting the output signal from the desired signal.

31. The method of claim 26, wherein the adaptive filter is used in an adaptive equalizer, an adaptive beam-former, and an interference canceller in a wireless communications system.

32. The method of claim 26 being further applied to an adaptive equalizer of a receiver, to an adaptive antenna of a base station, and to another wireless communications system based on a GSPT LMS algorithm.

33. The method of claim 26 being used for erasing inter-symbol interference (ISI) in a communications system and for reducing complexity of a system.

* * * * *